US012700866B2

(12) United States Patent
Chandrashekar

(10) Patent No.: US 12,700,866 B2
(45) Date of Patent: Aug. 4, 2026

(54) PHASE-LOCKED LOOP CLOCK DATA RECOVERY ARCHITECTURE

(71) Applicant: Apple Inc., Cupertino, CA (US)

(72) Inventor: Kailash Chandrashekar, Portland, OR (US)

(73) Assignee: Apple Inc., Cupertino, CA (US)

( * ) Notice: Subject to any disclaimer, the term of this patent is extended or adjusted under 35 U.S.C. 154(b) by 19 days.

(21) Appl. No.: 18/990,799

(22) Filed: Dec. 20, 2024

(65) Prior Publication Data

US 2026/0180583 A1     Jun. 25, 2026

(51) Int. Cl.
*H03D 3/24*      (2006.01)
*H03L 7/08*      (2006.01)
*H03L 7/091*     (2006.01)
*H03L 7/093*     (2006.01)

(52) U.S. Cl.
CPC ............ *H03L 7/0807* (2013.01); *H03L 7/091* (2013.01); *H03L 7/093* (2013.01)

(58) Field of Classification Search
CPC ........ H03L 7/0807; H03L 7/091; H03L 7/093
USPC ................................. 375/376, 316, 295, 219
See application file for complete search history.

(56) References Cited

U.S. PATENT DOCUMENTS

| | | | |
|---|---|---|---|
| 6,249,189 B1* | 6/2001 | Wu ...................... | H03L 7/1075 327/107 |
| 9,680,495 B1 | 6/2017 | Leong et al. | |
| 10,148,414 B2 | 12/2018 | Lugthart et al. | |
| 10,236,891 B1 | 3/2019 | Mehta et al. | |
| 10,291,239 B1* | 5/2019 | Wu ..................... | H03M 7/3022 |
| 11,705,914 B2 | 7/2023 | Nelson | |
| 11,706,061 B2 | 7/2023 | Stojanovic et al. | |
| 11,804,845 B2 | 10/2023 | Tajalli et al. | |

FOREIGN PATENT DOCUMENTS

| | | |
|---|---|---|
| CN | 101873133 B | 6/2012 |
| CN | 101969342 B | 8/2013 |
| JP | 2584352 B2 | 2/1997 |
| JP | 6009617 B2 | 10/2016 |

* cited by examiner

*Primary Examiner* — Zewdu A Kassa

(74) *Attorney, Agent, or Firm* — DICKINSON WRIGHT RLLP

(57) ABSTRACT

A clock data recovery circuit that uses a phase-locked loop circuit is disclosed. The clock data recovery circuit includes a phase circuit that generates a modulation signal using a recovered clock signal and an input signal that encodes multiple data symbols. A phase-locked loop circuit generates the recovered clock signal using the modulation signal and generates a feedback signal whose frequency is a non-integer factor of the of the recovered clock signal. The phase-locked loop circuit further generates the recovered clock signal using the feedback signal and a reference signal.

20 Claims, 9 Drawing Sheets

PHASE-LOCKED LOOP CLOCK DATA RECOVERY ARCHITECTURE

FIELD

This disclosure relates to the field of integrated circuit implementation and, more particularly, to the implementation of clock recovery circuits.

BACKGROUND

Computer systems typically include a number of interconnected integrated circuits. In some cases, the integrated circuits may communicate using communication channels or links to transmit and receive data symbols or bits. The communication channels may support parallel communication in which multiple data bits are transmitted in parallel, or serial communication in which data bits are transmitted one bit at a time in a serial fashion.

In the case of serial communication, some computer systems transmit serial data without a clock signal or other timing reference. As an integrated circuit receives such serial data, the integrated circuit may perform an operation referred to as clock recovery, in which a clock signal is generated using transitions in the received data. The resultant clock signal may then be used to sample the received data in order to reconstruct the encoded data symbols or bits.

DETAILED DESCRIPTION

Figure 1:
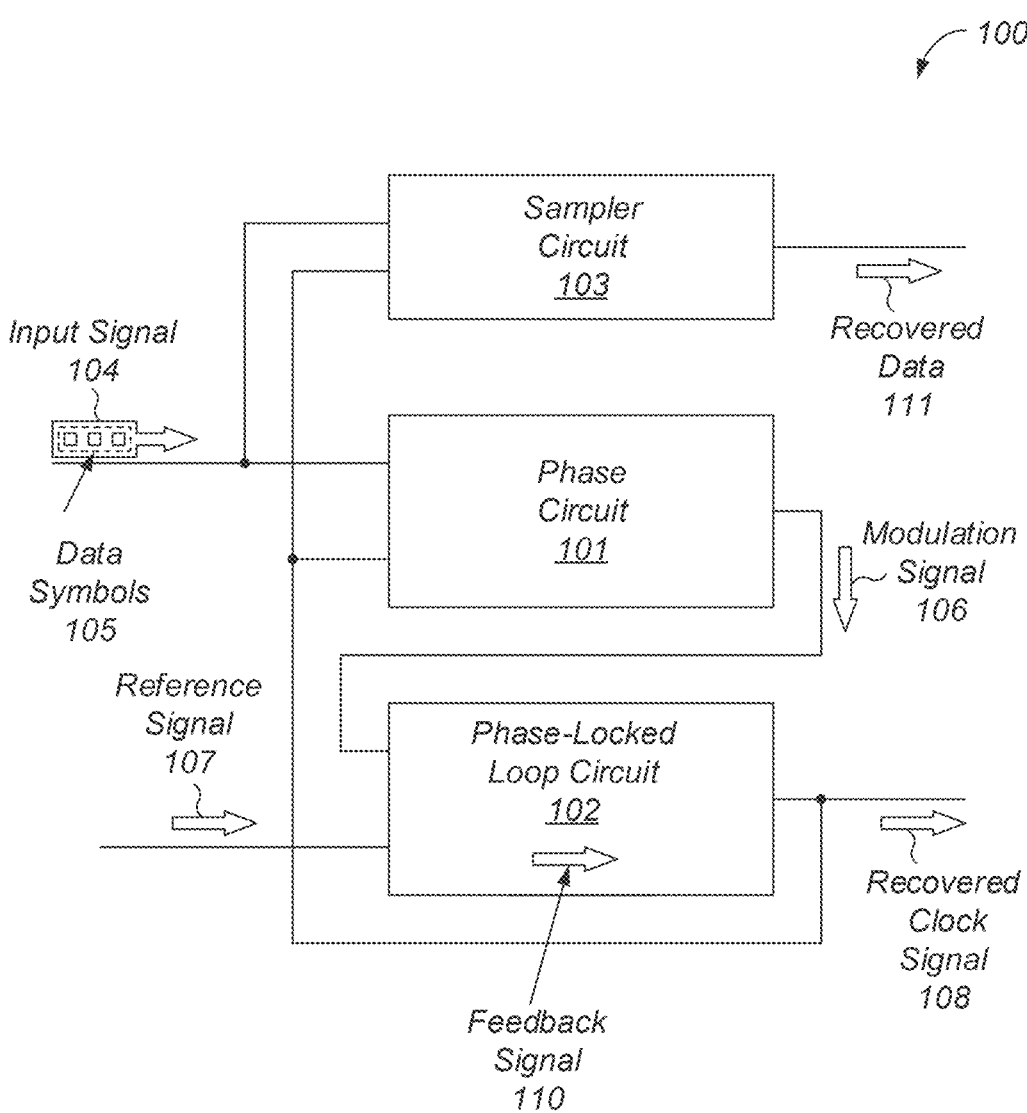
FIG. 1 is a block diagram depicting an embodiment of a clock data recovery circuit.

Computer systems may include multiple circuit blocks configured to send and receive data via signals propagating on communication links or channels, which can employ different communication protocols. For example, two circuit blocks may transmit data to each other in a serial fashion using serializer/de-serializer (SERDES) circuits.

In many serial communication protocols, data is transmitted without a time reference or clock signal. To extract the data, a receiver circuit may employ a clock-data recovery (CDR) circuit to generate a clock signal using timing information recovered from the received data signal. The CDR circuit continuously adjusts the phase and frequency of the generated clock signal to track the incoming data.

A clock-data recovery circuit has a finite bandwidth over which it can track random and deterministic jitter in the incoming data as well as in the clock generation circuits themselves. Residual jitter can result in closure of the data eye of the incoming data which can negatively impact the bit-error rate (BER). As such, minimizing the jitter contribution from the clock generation circuits is an important design consideration.

Additionally, at high data rates, e.g., 128 Gbits/s for PCIe 7, some receiver architectures employ analog-to-digital converter circuits to compensate for the high data rates. Such analog-to-digital converter circuit architectures, however, can have a higher latency compared to a mixed-signal based receiver architecture. An increase in latency in a receiver circuit can result in jitter peaking in a clock-data recovery circuit close to its bandwidth, making low latency in the clock-data recovery circuit another important design consideration.

The embodiments illustrated in the drawings and described below provide techniques for reducing jitter and latency in a clock-data recovery circuit. By employing a wide bandwidth phase-locked loop architecture in the clock-data recovery circuit, a ring oscillator circuit can be used instead of inductor-based oscillator circuits, saving design complexity and circuit area. The introduction of fractional divider circuit in the phase-locked loop architecture can allow for a frequency of the reference signal to be selected such that non-idealities in the fractional divider circuit are exercised at a frequency greater than a bandwidth of the phase-locked loop circuit, resulting in a suppression of deterministic jitter in the phase-locked loop circuit. Moreover, by using a two-point injection of the clock-data recovery modulation signal, the clock-data recovery circuit can respond more quickly to phase and frequency changes, thereby reducing latency.

A block diagram of a clock data recovery circuit is depicted in FIG. 1. As illustrated, clock data recovery circuit 100 includes phase circuit 101, phase-locked loop circuit 102, and sampler circuit 103.

Phase circuit 101 is configured to generate modulation signal 106 using input signal 104 and recovered clock signal 108. As described below, to generate modulation signal 106, phase circuit 101 may be configured to perform a phase-frequency comparison of input signal 104 to recovered clock signal 108 to generate an error signal, and then filter the error signal to generate modulation signal 106.

In various embodiments, input signal 104 encodes data symbols 105. In some cases, a given one of data symbols 105 may encode multiple data bits using different voltage levels for input signal 104. In some embodiments, input signal 104 may be differentially encoded using a voltage difference between two wires.

Phase-locked loop circuit 102 is configured to generate recovered clock signal 108 using modulation signal 106. In various embodiments, phase-locked loop circuit 102 may be further configured to generate feedback signal 110 using recovered clock signal 108. In some cases, a ratio of respective frequencies of recovered clock signal 108 and feedback signal 110 is a non-integer value. Using certain non-integer divisors (referred to as "fractional-N operation") to generate feedback signal 110 allows for a non-idealities in the circuit that generates feedback signal 110 from recovered clock signal 108 to be exercised at frequencies higher than the bandwidth of the phase-locked loop circuit thereby reducing deterministic jitter in recovered clock signal 108 arising from these non-idealities.

Additionally, phase-locked loop circuit 102 is further configured to generate feedback signal 110 using recovered clock signal 108, and modify recovered clock signal 108 using feedback signal 110 and reference signal 107.

Sampler circuit 103 is configured to generate recovered data 111 using input signal 104 and recovered clock signal 108. To generate recovered data 111, sampler circuit 103 may be configured to sample input signal 104 at times indicated by recovered clock signal 108. In cases where input signal 104 encodes a plurality of data symbols that correspond to respective sets of bits, sampler circuit 103 may be further configured to compare input signal 104 to one or more threshold voltage levels as part of the sampling operation.

Figure 2:
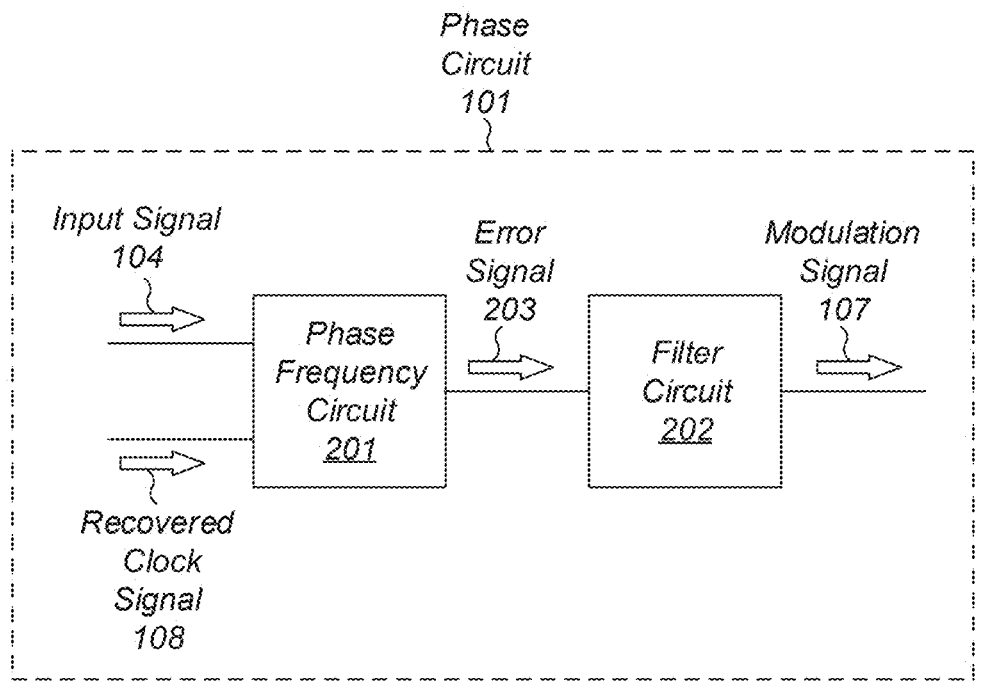
FIG. 2 is a block diagram depicting an embodiment of a phase circuit.

Turning to FIG. 2, a block diagram of phase circuit 101 is depicted. As illustrated, phase circuit 101 includes phase frequency circuit 201 and filter circuit 202.

Phase frequency circuit 201 is configured to generate error signal 203 using input signal 104 and recovered clock signal 108. In various embodiments, phase frequency circuit 201 may be further configured to generate error signal 203 based on a difference between the respective phases and/or frequencies of input signal 104 and recovered clock signal 108. For example, phase frequency circuit 201 may be configured to increase a value of error signal 203 in response to a greater phase and/or frequency difference between input signal 104 and recovered clock signal 108. In various embodiments, phase frequency circuit 201 may be implemented using multiple flip-flop circuits along with multiple combinatorial logic gates configured to detect which of input signal 104 and recovered clock signal 108 transitions first and more often.

Filter circuit 202 is configured to generate modulation signal 106 using error signal 203. In various embodiments, to generate error signal 203, filter circuit 202 is configured to attenuate rapid changes in error signal 203 by performing a low-pass filter operation. In various embodiments, filter circuit 202 may be implemented as a microcontroller, state machine, or other suitable sequential logic circuit configured to reject frequency components in error signal 203 above a threshold value.

Figure 3:
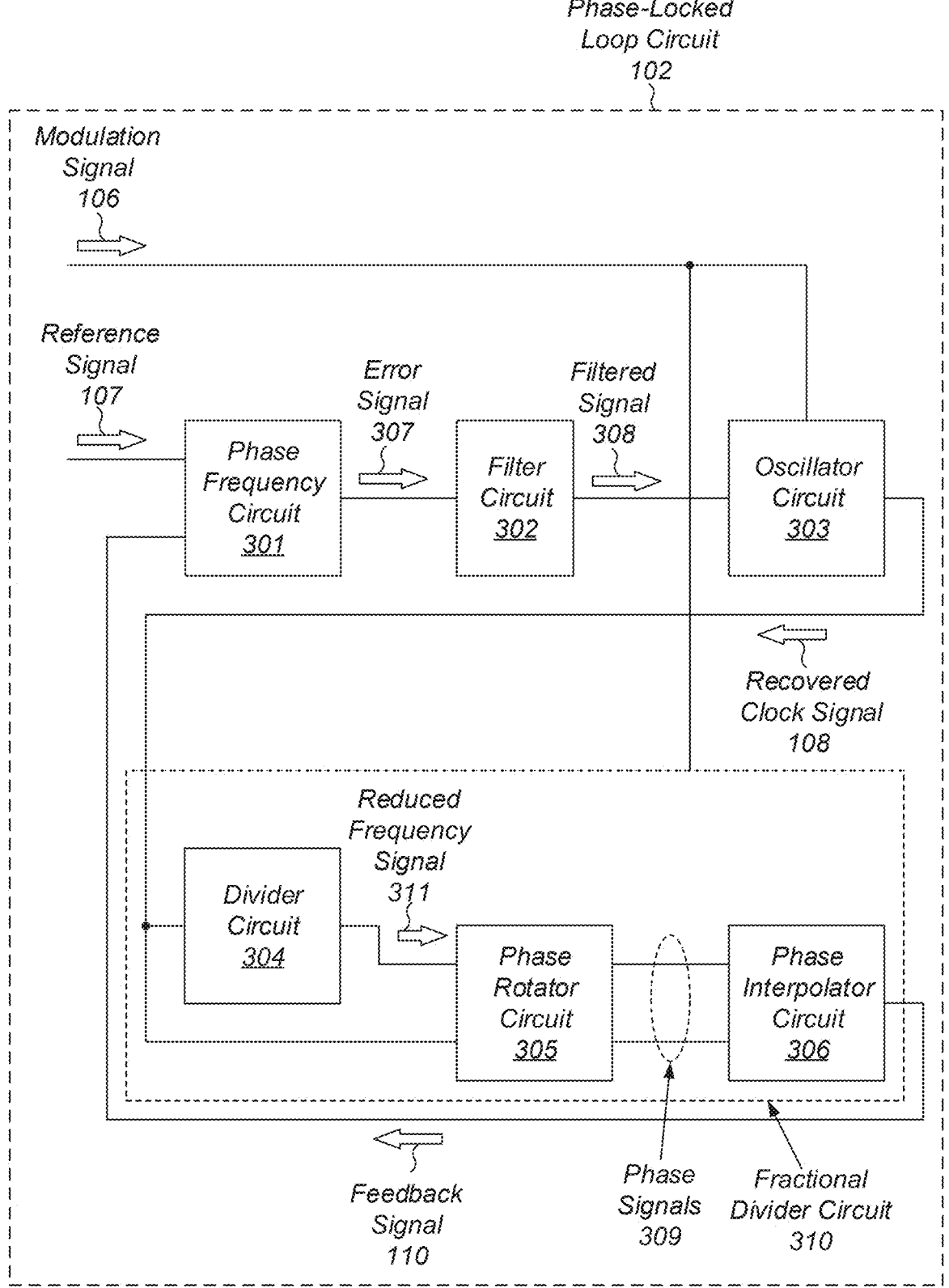
FIG. 3 is a block diagram depicting an embodiment of a phase-locked loop circuit.

Turning to FIG. 3, a block diagram of an embodiment of phase-locked loop circuit 102 is depicted. As illustrated, phase-locked loop circuit 102 includes phase frequency circuit 301, filter circuit 302, oscillator circuit 303, and fractional divider circuit 310.

Phase frequency circuit 301 is configured to generate error signal 307 using reference signal 107 and feedback signal 110. In various embodiments, to generate error signal 307, phase frequency circuit 301 may be configured to determine differences between the respective phases and frequencies of reference signal 107 and feedback signal 110. In various embodiments, phase frequency circuit 301 may be implemented using multiple flip-flop circuits along with multiple combinatorial logic gates configured to detect which of reference signal 107 and feedback signal 110 transitions first and more often.

Filter circuit 302 is configured to generate filtered signal 308 using error signal 307. In various embodiments, to generate filtered signal 308, filter circuit 302 is configured to attenuate rapid changes in error signal 307 by performing a low-pass filter operation. In various embodiments, filter circuit 302 may be implemented as a proportional integral controller, a microcontroller, state machine, or other suitable sequential logic circuit configured to reject frequency components in error signal 307 above a threshold value.

Oscillator circuit 303 is configured to generate recovered clock signal 108 using filtered signal 308 and modulation signal 106. As described below, oscillator circuit 303 may include a ring oscillator circuit whose frequency can be adjusted using either an analog or digital signal.

Fractional divider circuit 310 is configured to generate feedback signal 110 using recovered clock signal 108. In some embodiments, fractional divider circuit 310 may be further configured to use both recovered clock signal 108 and modulation signal 106 to generate feedback signal 110. In various embodiments, a ratio of the respective frequencies of recovered clock signal 108 and feedback signal 110 may be a non-integer value.

As described below, the effect of modulation signal 106 in the generation of recovered clock signal 108 may experience a latency that is a function of the bandwidth of phase-locked loop circuit 102. In some embodiments, to reduce this latency, modulation signal 106 may be injected, as part of a 2-point injection scheme, directly into oscillator circuit 303.

Fractional divider circuit 310 may employ various circuit topologies in the generation of feedback signal 110. As illustrated, fractional divider circuit 310 may include divider circuit 304, phase rotator circuit 305, and phase interpolator circuit 306, each of which may contributed to the overall non-integer divisor. For example, for a divisor of 3.3, divider circuit 304 may be configured to divide by 3, phase rotator circuit 305 may be configured to further divide by 0.25, and phase interpolator circuit 306 may be configured to further divide by 0.05. It is noted that the topology depicted in the embodiment of FIG. 3 is an example. Other circuit topologies for fractional divider circuit 310 are possible and contemplated.

Divider circuit 304 is configured to generate reduced frequency signal 311 using recovered clock signal 108. In some embodiments, divider circuit 304 may be further configured to use modulation signal 106 in addition to recovered clock signal 108 to generate reduced frequency signal 311. In various embodiments, a frequency of reduced frequency signal 311 may be less than a frequency of recovered clock signal 108. In other embodiments, divider circuit 304 may be implemented using a counter circuit or other suitable sequential logic circuit, and one or more combinatorial logic gates configured to generate a transition in reduced frequency signal 109 in response to a value of the counter circuit satisfying one or more threshold values.

Phase rotator circuit 305 is configured to generate phase signals 309 using reduced frequency signal 109 and recovered clock signal 108. In some embodiments, phase rotator circuit 305 may be further configured to use modulation signal 106 in additional to reduced frequency signal 311 and recovered clock signal 108 to generate phase signals 309. To generate phase signals 309, phase rotator circuit 305 may be further configured to rotate the respective phases of reduced frequency signal 109 and recovered clock signal 108 by a predetermined number of degrees. In some embodiments, the predetermined number of degrees may be programmable based on operational parameters of clock data recovery circuit 100, characteristics of input signal 104, or any other suitable metric.

Phase interpolator circuit 306 is configured to generate feedback signal 110 using phase signals 309. It some cases, phase interpolator circuit 306 may be further configured to use modulation signal 106 in addition to phase signals 309 to generate feedback signal 110. In various embodiments, to generate feedback signal 110, phase interpolator circuit 306 may be configured to generate feedback signal 110 such that a phase of feedback signal 110 is between the respective phases of phase signals 309. In some embodiments, phase interpolator circuit 306 may employ a control signal that determines a level of mixing between phase signals 309. For example, a mid-range value for the control signal may result in phase interpolator circuit 306 generating feedback signal 110 with a phase that is between the respective phases of phase signals 309. Alternative, phase interpolator circuit 306 may be implemented using a tunable delay circuit.

As described above, phase interpolator circuit 306 may be further configured to use modulation signal 106 to generate feedback signal 110. Divider circuit 304, phase rotator circuit 305, and phase interpolator circuit, or any suitable subset thereof, may modulate the phase of feedback signal 110 according to modulation signal 106. Phase-locked loop circuit 102 will attempt to phase align reference signal 107 and feedback signal 110, i.e., to drive error signal 307 to a zero value. During this process, the phase of recovered clock signal 108 will change such that feedback signal 110 and reference signal 107 are phase aligned. It is noted that the effect of modulation signal 106 experiences some latency that is a function of the bandwidth of phase-locked loop circuit 102. For example, a higher bandwidth for phase-locked loop circuit 102 can reduced the latency of the effect of modulation signal 106.

Figure 4A:
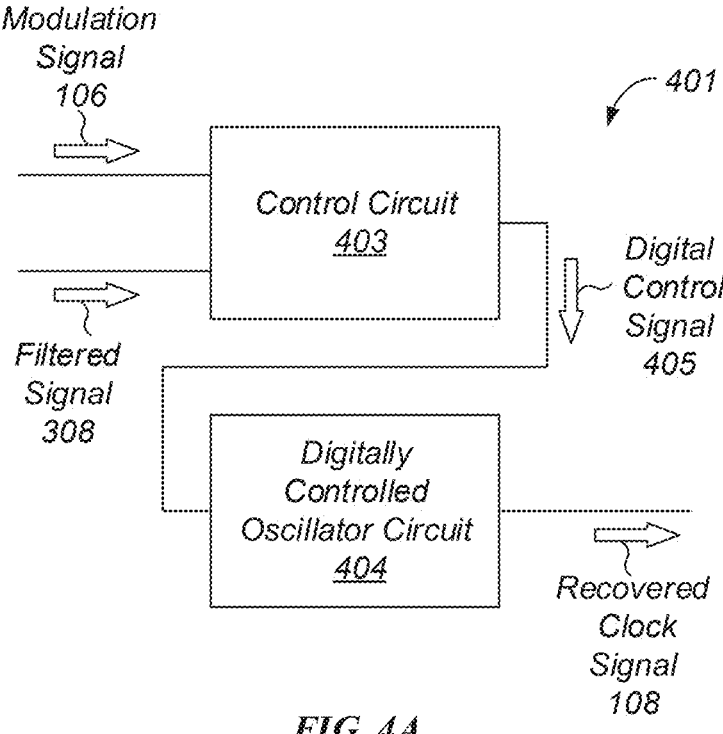
FIG. 4A is a block diagram depicting an embodiment of an oscillator circuit.

Turning to FIG. 4A, a block diagram of an embodiment of oscillator circuit 303 is depicted. As illustrated, oscillator circuit 401 includes control circuit 403 and digitally controlled oscillator circuit 404.

Control circuit 403 is configured to generate digital control signal 405 using modulation signal 106 and filtered signal 308. Although depicted as a single wire, in various embodiments, digital control signal 405 may include multiple wires that encode multiple bits of information.

In various embodiments, control circuit 403 may be implemented using any suitable combination of sequential and combinatorial logic circuits. In some cases, control circuit 403 may be implemented as a state machine, microcontroller, or other suitable sequential logic circuit.

Digitally controlled oscillator circuit 404 is configured to generate recovered clock signal 108 using modulation signal 106 and filtered signal 308. In various embodiments, digitally controlled oscillator circuit 404 may be further configured to change a frequency of recovered clock signal 108 based on changes in digital control signal 405. For example, in response to an increase in the value of digital control signal 405, digitally controlled oscillator circuit 404 may be further configured to increase the frequency of recovered clock signal 108.

In various embodiments, digitally controlled oscillator circuit 404 may be implemented as a ring oscillator circuit that includes multiple inverter stages coupled together in a daisy chain fashion. In some embodiments, a voltage level of a power supply node for the multiple inverter stages may be adjusted using an adjustable resistor whose value is dependent on the value of digital control signal 405. In other embodiments, different circuit techniques may be employed to adjust the frequency of the ring oscillator circuit using digital control signal 405.

Figure 4B:
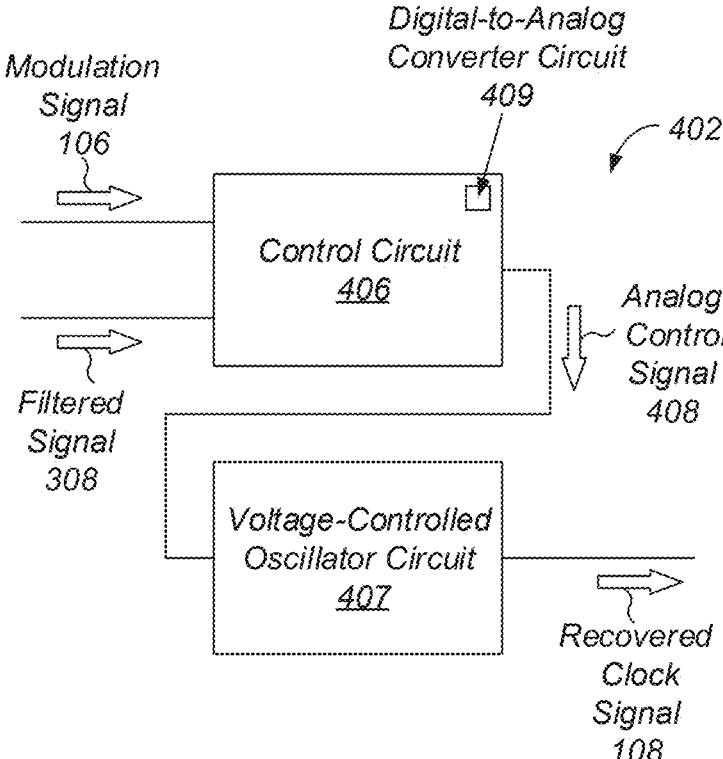
FIG. 4B is a block diagram depicting a different embodiment of an oscillator circuit.

A block diagram of another embodiment of oscillator circuit 303 is depicted in FIG. 4B. As illustrated, oscillator circuit 402 includes control circuit 406 and voltage-controlled oscillator circuit 407.

Control circuit 406 is configured to generate analog control signal 408 using modulation signal 106 and filtered signal 308. In various embodiments, control circuit 406 may be further configured to adjust a voltage level of analog control signal 408 using modulation signal 106 and filtered signal 308. For example, control circuit 406 may be configured to increase the voltage level of analog control signal 408 in response to an increase in the value of filtered signal 308.

In various embodiments, control circuit 406 may include digital-to-analog converter circuit 409 which is configured to adjust the voltage level of analog control signal 408 using a digital word based on modulation signal 106 and filtered signal 308. In some embodiments, control circuit 406 may include a state machine or other combination of sequential and combinatorial logic circuits that combine modulation signal 106 and filtered signal 308 to generate the digital word.

Voltage-controlled oscillator circuit 407 is configured to generate recovered clock signal 108 using analog control signal 408. In various embodiments, voltage-controlled oscillator circuit 407 may be further configured to adjust a frequency of recovered clock signal 108 based on a voltage level of analog control signal 408. For example, voltage-controlled oscillator circuit 407 may be configured to increase a frequency of recovered clock signal 108 in response to a decrease in the voltage level of analog control signal 408.

In various embodiments, voltage-controlled oscillator circuit 407 may be implemented as a ring oscillator circuit that includes multiple inverter stages coupled together in a daisy chain fashion. In some embodiments, a voltage level of a power supply node for the multiple inverter stages may be adjusted using a transistor, or other suitable transconductance device, whose impedance is dependent on a voltage level of analog control signal 408. In other embodiments, different circuit techniques may be employed to adjust the frequency of the ring oscillator circuit using analog control signal 408.

Figure 5:
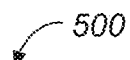
FIG. 5 is a block diagram depicting an embodiment of a system that includes a clock data recovery circuit.
Figure 5:
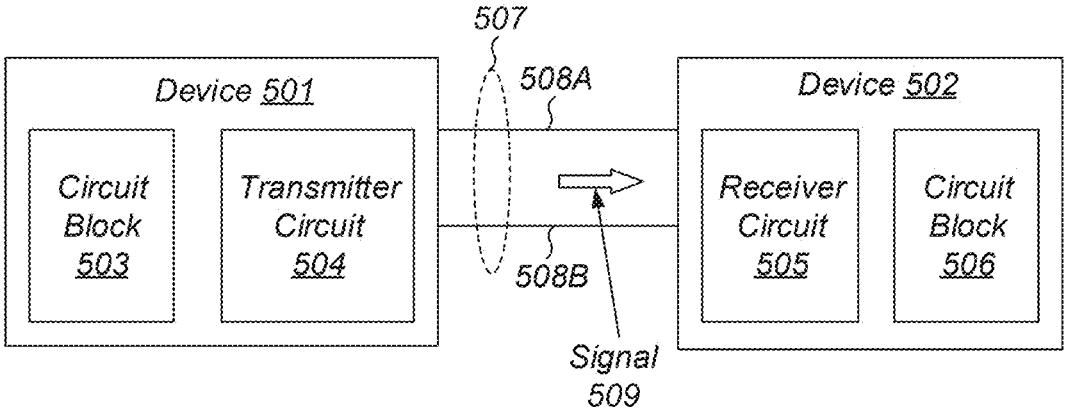

As described above, a clock data recovery circuit, such as clock data recovery circuit 100, may be employed in a computer system that includes multiple devices coupled to a communication channel or link. A block diagram of an embodiment of such a computer system is depicted in FIG. 5. As illustrated, computer system 500 includes devices 501 and 502, coupled by communication bus 507.

Device 501 includes circuit block 503 and transmitter circuit 504. In various embodiments, device 501 may be a processor circuit, a processor core, a memory circuit, or any other suitable circuit block that may be included on an integrated circuit in a computer system. It is noted that although device 501 only depicts a single circuit block and a single transmitter circuit, in other embodiments, additional circuit blocks and additional transmitter circuits may be employed.

Transmitter circuit 504 is configured to serially transmit signal 509, via communication bus 507, corresponding to data received from circuit block 503. Such signals may differentially encode one or more bits or symbols such that a difference between the respective voltage levels of wires 508A and 508B, at a particular point in time, corresponding to a particular bit or symbol value. In some cases, the generation of signal 509 may include encoding the bits prior to transmission. It is noted that although communication bus 507 is depicted as including two wires, in other embodiments, any suitable number of wires may be employed.

Device 502 includes receiver circuit 505 and circuit block 506. Like device 501, device 502 may be a processor circuit, a processor core, a memory circuit, or any other suitable circuit block configured to receive data from transmitter circuit 504. In various embodiments, receiver circuit 505 may include clock data recovery circuit 100 as depicted in FIG. 1.

Devices 501 and 502 may, in some embodiments, be fabricated on a common integrated circuit. In other embodiments, devices 501 and 502 may be located on different integrated circuits mounted on a common substrate or circuit board. In such cases, communication bus 507 may include metal or other conductive traces on the substrate or circuit boards. Although only two devices are depicted in computer system 500, in other embodiments, any suitable number of devices may be employed.

To summarize, various embodiments of a clock data recovery circuit implemented with a phase-locked loop circuit are disclosed. Broadly speaking, the clock data recovery circuit includes a phase circuit and a phase-locked loop circuit. The phase circuit may be configured to generate a modulation signal using an input signal and a recovered clock signal. The input signal may encode a plurality of data symbols. The phase-locked loop circuit may be configured to generate the recovered clock signal using the modulation signal, and generate a feedback signal using the recovered clock signal. A ratio of respective frequencies of the feedback signal and the recovered clock signal may be a non-integer value. The phase-locked loop circuit may be further configured to modify the recovered clock signal using the feedback signal and a reference signal.

Figure 6:
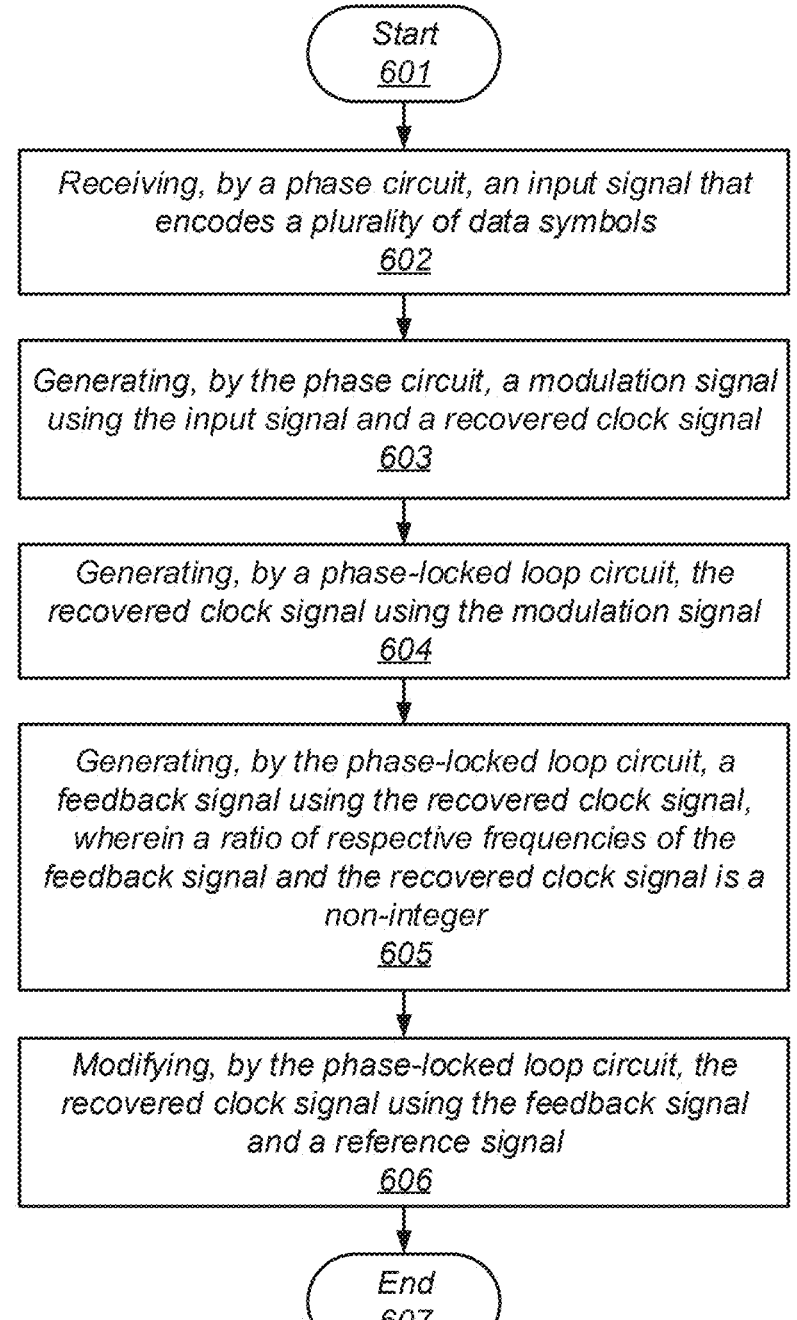
FIG. 6 is a flow diagram depicting an embodiment of a method for performing clock data recovery.

A flow diagram depicting an embodiment of a method for performing clock data recovery is illustrated in FIG. 6. The method, which may be applied to various clock data recovery circuits, e.g., clock data recovery circuit 100 as depicted in FIG. 1, begins in block 601.

The method includes receiving, by a phase circuit, an input signal that encodes a plurality of data symbols (block 602). In various embodiments, the input signal may be a differential signal that encodes the plurality of data symbols using a difference in respective voltage levels of a first signal and a second signal included in the differential signal.

The method further includes generating, by the phase circuit, a modulation signal using the input signal and a recovered clock signal (block 603). In some embodiments, generating the modulation signal may include performing, by the phase circuit, a phase-frequency comparison of the input signal and the recovered clock signal to generate an error signal, and filtering, by the phase circuit, the error signal to generate the modulation signal.

The method also includes generating, by a phase-locked loop circuit, the recovered clock signal using the modulation signal (block 604). In various embodiments, generating the recovered clock signal includes adjusting a frequency of an oscillator circuit using the modulation signal. In some embodiments, adjusting the frequency of the oscillator circuit may include performing a digital-to-analog conversion operation on the modulation signal to generate an analog control signal, and adjusting the frequency of the oscillator circuit using the analog control signal.

The method further includes generating, by the phase-locked loop circuit, a feedback signal using the recovered clock signal (block 605). In various embodiments, a ratio of respective frequencies of the feedback signal and the recovered clock signal is a non-integer value.

In some embodiments, generating the feedback signal may include generating, by the phase-locked loop circuit, a reduced frequency signal whose frequency is less than that of the recovered clock signal. In such cases, the method may also include generating, by the phase-locked loop circuit, a plurality of phase signals using the reduced frequency signal, and generating, by the phase-locked loop circuit using the modulation signal, the feedback signal based on respective phases of at least two phase signals of the plurality of phase signals. In other embodiments, generating the feedback signal may include determining, by the phase-locked loop circuit, a phase relationship between the feedback signal and the at least two phase signals using the modulation signal.

The method further includes modifying, by the phase-locked loop circuit, the recovered clock signal using the feedback signal and a reference signal (block 606). In some embodiments, modifying the recovered clock signal includes performing, by the phase-locked loop circuit, a phase-frequency comparison of the reference signal and the feedback signal to generate a phase-difference signal. In such cases, the method may additionally include filtering, by the phase-locked loop circuit, the phase-difference signal to generate a filtered signal, and adjusting, by the phase-locked loop circuit, a frequency of the recovered clock signal using the filtered signal. In various embodiments, the method may additionally include adjusting, by the phase-locked loop circuit, the frequency of the recovered clock signal using the filtered signal and the modulation signal.

In some embodiments, the method may include sampling, by the sampler circuit using the recovered clock signal, the input signal to generate a plurality of recovered data symbols. The method concludes in block 607.

Figure 7:
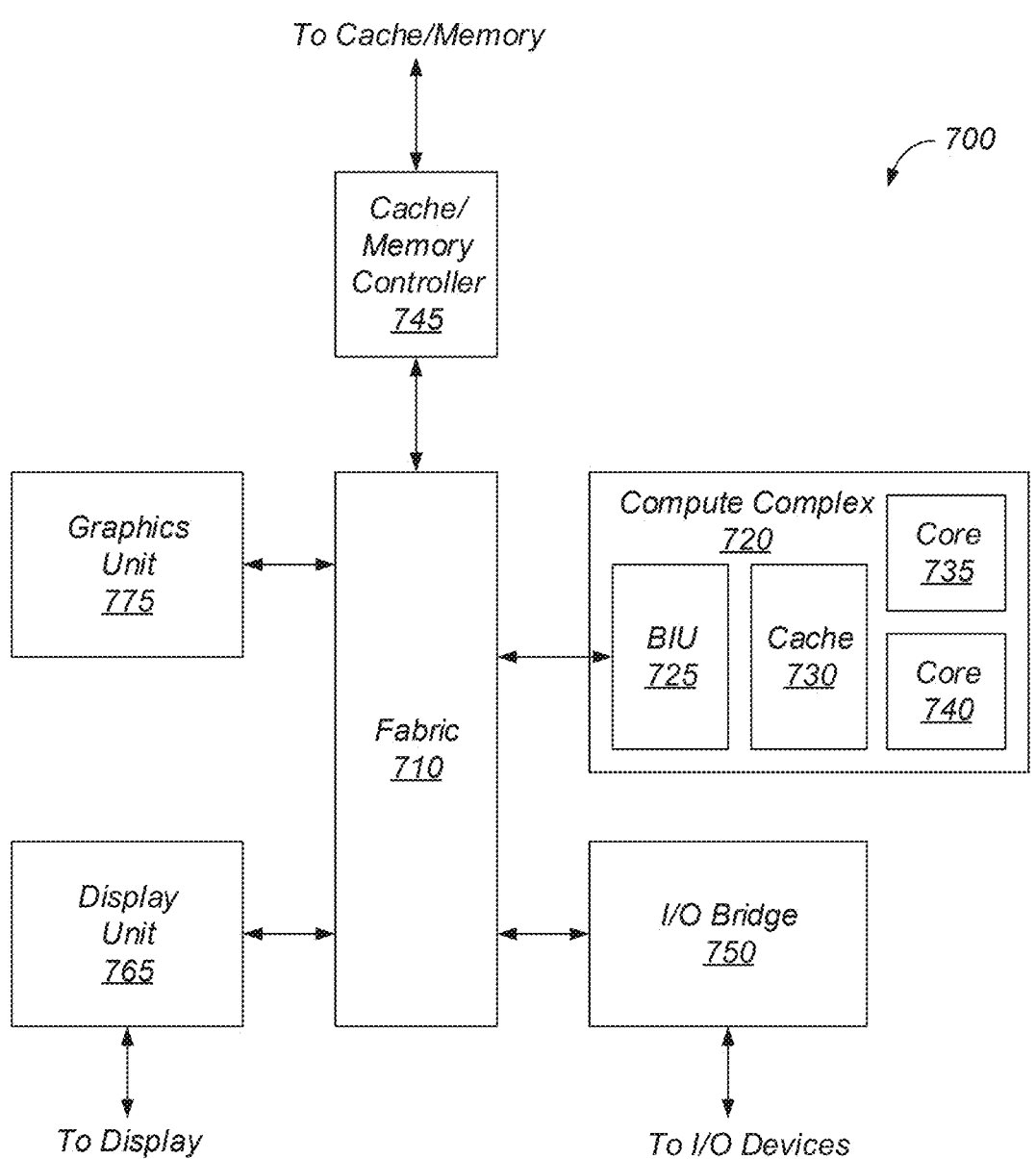
FIG. 7 is a block diagram of an embodiment of a device that may include logic gates.

Referring now to FIG. 7, a block diagram illustrating an example embodiment of a device is shown. In some embodiments, elements of device 700 may be included within a system-on-a-chip. In some embodiments, device 700 may be included in a mobile device, which may be battery-powered. Therefore, power consumption by device 700 may be an important design consideration. In the illustrated embodiment, device 700 includes fabric 710, compute complex 720, input/output (I/O) bridge 750, cache/memory controller 745, graphics unit 775, and display unit 765. In some embodiments, device 700 may include other components (not shown) in addition to, or in place of, the illustrated components, such as video processor encoders and decoders, image processing or recognition elements, computer vision elements, etc.

Fabric 710 may include various interconnects, buses, MUX's, controllers, etc., and may be configured to facilitate communication between various elements of device 700. In some embodiments, portions of fabric 710 may be configured to implement various different communication protocols. In other embodiments, fabric 710 may implement a single communication protocol, and elements coupled to fabric 710 may convert from the single communication protocol to other communication protocols internally.

In the illustrated embodiment, compute complex 720 includes bus interface unit (BIU) 725, cache 730, and cores 735 and 740. In various embodiments, compute complex 720 may include various numbers of processors, processor cores, and caches. For example, compute complex 720 may include 1, 2, or 4 processor cores, or any other suitable number. In one embodiment, cache 730 is a set associative L2 cache. In some embodiments, cores 735 and 740 may include internal instruction and data caches. In some embodiments, a coherency unit (not shown) in fabric 710, cache 730, or elsewhere in device 700, may be configured to maintain coherency between various caches of device 700. BIU 725 may be configured to manage communication between compute complex 720 and other elements of device 700. Processor cores, such as cores 735 and 740, may be configured to execute instructions of a particular instruction set architecture (ISA) which may include operating system instructions and user application instructions. These instructions may be stored in a computer readable medium such as a memory coupled to cache/memory controller 745 as discussed below.

As used herein, the term "coupled to" may indicate one or more connections between elements, and a coupling may include intervening elements. For example, in FIG. 7, graphics unit 775 may be described as "coupled to" a memory through fabric 710 and cache/memory controller 745. In contrast, in the illustrated embodiment of FIG. 7, graphics unit 775 is "directly coupled" to fabric 710 because there are no intervening elements.

Cache/memory controller 745 may be configured to manage transfer of data between fabric 710 and one or more caches and memories. For example, cache/memory controller 745 may be coupled to an L3 cache, which may, in turn, be coupled to a system memory. In other embodiments, cache/memory controller 745 may be directly coupled to a memory. In some embodiments, cache/memory controller 745 may include one or more internal caches. Memory coupled to cache/memory controller 745 may be any type of volatile memory, such as dynamic random access memory (DRAM), synchronous DRAM (SDRAM), double data rate (DDR, DDR2, DDR3, etc.) SDRAM (including mobile versions of SDRAMs such as mDDR3, etc., and/or low power versions of SDRAMs such as LPDDR4, etc.), RAMBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an integrated circuit in a chip-on-chip configuration, a package-on-package configuration, or a multi-chip module configuration. Memory coupled to cache/memory controller 745 may be any type of non-volatile memory such as NAND flash memory, NOR flash memory, nano RAM (NRAM), magneto-resistive RAM (MRAM), phase change RAM (PRAM), Racetrack memory, Memristor memory, etc. As noted above, this memory may store program instructions executable by compute complex 720 to cause the computing device to perform functionality described herein.

Graphics unit 775 may include one or more processors, e.g., one or more graphics processing units (GPUs). Graphics unit 775 may receive graphics-oriented instructions, such as OPENGL®, Metal®, or DIRECT3D® instructions, for example. Graphics unit 775 may execute specialized GPU instructions or perform other operations based on the received graphics-oriented instructions. Graphics unit 775 may generally be configured to process large blocks of data in parallel, and may build images in a frame buffer for output to a display, which may be included in the device or may be a separate device. Graphics unit 775 may include transform, lighting, triangle, and rendering engines in one or more graphics processing pipelines. Graphics unit 775 may output pixel information for display images. Graphics unit 775, in various embodiments, may include programmable shader circuitry which may include highly parallel execution cores configured to execute graphics programs, which may include pixel tasks, vertex tasks, and compute tasks (which may or may not be graphics-related).

Display unit 765 may be configured to read data from a frame buffer and provide a stream of pixel values for display. Display unit 765 may be configured as a display pipeline in some embodiments. Additionally, display unit 765 may be configured to blend multiple frames to produce an output frame. Further, display unit 765 may include one or more interfaces (e.g., MIPI® or embedded display port (eDP)) for coupling to a user display (e.g., a touchscreen or an external display).

I/O bridge 750 may include various elements configured to implement universal serial bus (USB) communications, security, audio, and low-power always-on functionality, for example. I/O bridge 750 may also include interfaces such as pulse-width modulation (PWM), general-purpose input/output (GPIO), serial peripheral interface (SPI), and inter-integrated circuit (I2C), for example. Various types of peripherals and devices may be coupled to device 700 via I/O bridge 750.

In some embodiments, device 700 includes network interface circuitry (not explicitly shown), which may be connected to fabric 710 or I/O bridge 750. The network interface circuitry may be configured to communicate via various networks, which may be wired, wireless, or both. For example, the network interface circuitry may be configured to communicate via a wired local area network, a wireless local area network (e.g., via Wi-Fi™), or a wide area network (e.g., the Internet or a virtual private network). In some embodiments, the network interface circuitry is configured to communicate via one or more cellular networks that use one or more radio access technologies. In some embodiments, the network interface circuitry is configured to communicate using device-to-device communications (e.g., Bluetooth® or Wi-Fi™ Direct), etc. In various embodiments, the network interface circuitry may provide device 700 with connectivity to various types of other devices and networks.

Figure 8:
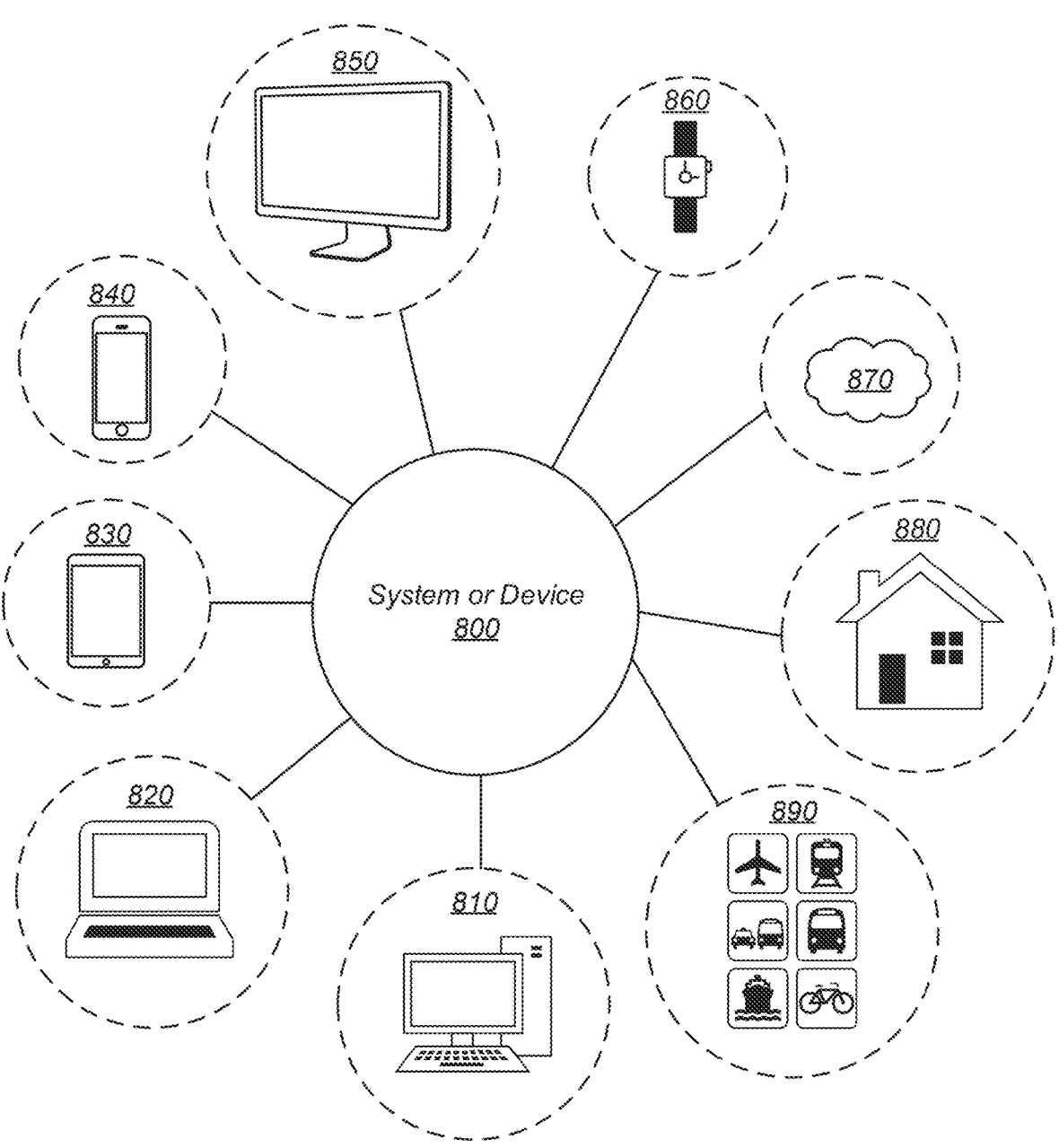
FIG. 8 is a block diagram of various embodiments of computer systems that may include logic gates.

Turning now to FIG. 8, various types of systems that may include any of the circuits, devices, or systems discussed above are illustrated. System or device 800, which may incorporate or otherwise utilize one or more of the techniques described herein, may be utilized in a wide range of areas. For example, system or device 800 may be utilized as part of the hardware of systems such as a desktop computer 810, laptop computer 820, tablet computer 830, cellular or mobile phone 840, or television 850 (or set-top box coupled to a television).

Similarly, disclosed elements may be utilized in a wearable device 860, such as a smartwatch or a health-monitoring device. Smartwatches, in many embodiments, may implement a variety of different functions—for example, access to email, cellular service, calendar, health monitoring, etc. A wearable device may also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 800 may also be used in various other contexts. For example, system or device 800 may be utilized in the context of a server computer system, such as a dedicated server or on shared hardware that implements a cloud-based service 870. Still further, system or device 800 may be implemented in a wide range of specialized everyday devices, including devices 880 commonly found in the home such as refrigerators, thermostats, security cameras, etc. The interconnection of such devices is often referred to as the "Internet of Things" (IoT). Elements may also be implemented in various modes of transportation. For example, system or device 800 could be employed in the control systems, guidance systems, entertainment systems, etc. of various types of vehicles 890.

The applications illustrated in FIG. 8 are merely exemplary and are not intended to limit the potential future applications of disclosed systems or devices. Other example applications include, without limitation: portable gaming devices, music players, data storage devices, unmanned aerial vehicles, etc.

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that programs a computing system to generate a simulation model of the hardware circuit, programs a fabrication system configured to produce hardware (e.g., an integrated circuit) that includes the disclosed circuitry, etc. Claims to such a storage medium are intended to cover, for example, an entity that produces a circuit design, but does not itself perform complete operations such as design simulation, design synthesis, circuit fabrication, etc.

Figure 9:
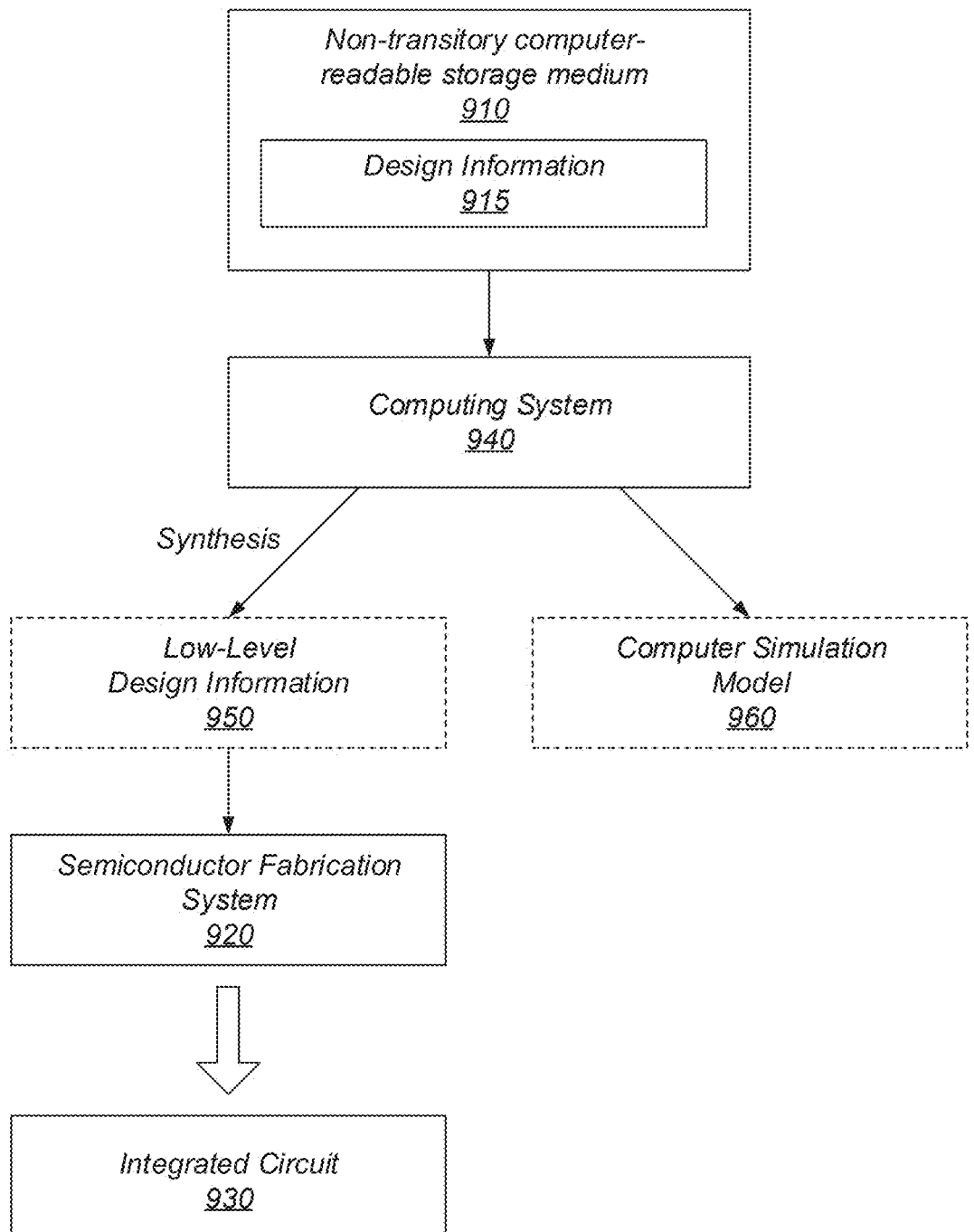
FIG. 9 illustrates an example of a non-transitory computer-readable storage medium that stores circuit design information.

FIG. 9 is a block diagram illustrating an example of a non-transitory computer-readable storage medium that stores design information 915, according to some embodiments. In the illustrated embodiment, computing system 940 is configured to process design information 915. This may include executing instructions included in design information 915, interpreting instructions included in design information 915, compiling, transforming, or otherwise updating design information 915, etc. Therefore, design information 915 controls computing system 940 (e.g., by programming computing system 940) to perform various operations discussed below, in some embodiments.

In the illustrated example, computing system 940 processes design information 915 to generate both computer simulation model of hardware circuit 960 and low-level design information 950. In other embodiments, computing system 940 may generate only one of these outputs, may generate other outputs based on design information 915, or both. Regarding computer simulation model of hardware circuit 960, computing system 940 may execute instructions of a hardware description language that includes register transfer level (RTL) code, behavioral code, structural code, or some combination thereof. The simulation model may perform the functionality specified by design information 915, facilitate verification of the functional correctness of the hardware design, generate power consumption estimates, generate timing estimates, etc.

In the illustrated example, computing system 940 also processes design information 915 to generate low-level design information 950 (e.g., gate-level design information, a netlist, etc.). This may include synthesis operations, as shown, such as constructing a multi-level network, optimizing the network using technology-independent techniques, technology dependent techniques, or both, and outputting a network of gates (with potential constraints based on available gates in a technology library, sizing, delay, power, etc.). Based on low-level design information 950 (potentially among other inputs), semiconductor fabrication system 920 is configured to fabricate integrated circuit 930 (which may correspond to functionality of the computer simulation model of hardware circuit 960). Note that computing system 940 may generate different simulation models based on design information at various levels of description, including low-level design information 950, design information 915, and so on. The data representing low-level design information 950 and computer simulation model of hardware circuit 960 may be stored on non-transitory computer-readable storage medium 910, or on one or more other media.

In some embodiments, low-level design information 950 controls (e.g., programs) semiconductor fabrication system 920 to fabricate integrated circuit 930. Thus, when processed by the fabrication system, the design information may program the fabrication system to fabricate a circuit that includes various circuitry disclosed herein.

Non-transitory computer-readable storage medium 910 may comprise any of various appropriate types of memory devices or storage devices. Non-transitory computer-readable storage medium 910 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash memory, magnetic media, e.g., a hard drive, or optical storage; registers, or other similar types of memory elements, etc. Non-transitory computer-readable storage medium 910 may include other types of non-transitory memory as well, or combinations thereof. Accordingly, non-transitory computer-readable storage medium 910 may include two or more memory media, which may reside in different locations—for example, in different computer systems that are connected over a network.

Design information 915 may be specified using any of various appropriate computer languages, including hardware description languages such as, without limitation: VHDL, Verilog, SystemC, System Verilog, RHDL, M, MyHDL, etc. The format of various design information may be recognized by one or more applications executed by computing system 940, semiconductor fabrication system 920, or both. In some embodiments, design information 915 may also include one or more cell libraries that specify the synthesis, layout, or both of integrated circuit 930. In some embodiments, design information 915 is specified in whole, or in part, in the form of a netlist that specifies cell library elements and their connectivity. Design information discussed herein, taken alone, may or may not include sufficient information for fabrication of a corresponding integrated circuit. For example, design information may specify the circuit elements to be fabricated but not their physical layout. In this case, design information may be combined with layout information to actually fabricate the specified circuitry.

Integrated circuit 930 may, in various embodiments, include one or more custom macrocells, such as memories, analog or mixed-signal circuits, and the like. In such cases, design information 915 may include information related to included macrocells. Such information may include, without limitation, schematics capture database, mask design data, behavioral models, and device or transistor level netlists. Mask design data may be formatted according to graphic data system (GDSII), or any other suitable format.

Semiconductor fabrication system 920 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 920 may also be configured to perform various testing of fabricated circuits for correct operation.

In various embodiments, integrated circuit 930 and computer simulation model of hardware circuit 960 are configured to operate according to a circuit design specified by design information 915, which may include performing any of the functionality described herein. For example, integrated circuit 930 may include any of various elements shown in FIGS. 1-5. Further, integrated circuit 930 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components. Similarly, stating "instructions of a hardware description programming language" that are "executable" to program a computing system to generate a computer simulation model does not imply that the instructions must be executed in order for the element to be met, but rather, specifies characteristics of the instructions. Additional features relating to the model (or the circuit represented by the model) may similarly relate to characteristics of the instructions, in this context. Therefore, an entity that sells a computer-readable medium with instructions that satisfy recited characteristics may provide an infringing product, even if another entity actually executes the instructions on the medium.

Note that a given design, at least in the digital logic context, may be implemented using a multitude of different gate arrangements, circuit technologies, etc. As one example, different designs may select or connect gates based on design tradeoffs (e.g., to focus on power consumption, performance, circuit area, etc.). Further, different manufacturers may have proprietary libraries, gate designs, physical gate implementations, etc. Different entities may also use different tools to process design information at various layers (e.g., from behavioral specifications to physical layout of gates).

Once a digital logic design is specified, however, those skilled in the art need not perform substantial experimentation or research to determine those implementations. Rather, those of skill in the art understand procedures to reliably and predictably produce one or more circuit implementations that provide the function described by design information 915. The different circuit implementations may affect the performance, area, power consumption, etc. of a given design (potentially with tradeoffs between different design goals), but the logical function does not vary among the different circuit implementations of the same circuit design.

In some embodiments, the instructions included in design information 915 provide RTL information (or other higher-level design information) and are executable by the computing system to synthesize a gate-level netlist that represents the hardware circuit based on the RTL information as an input. Similarly, the instructions may provide behavioral information and be executable by the computing system to synthesize a netlist or other lower-level design information included in low-level design information 950. Low-level design information 950 may program semiconductor fabrication system 920 to fabricate integrated circuit 930.

The present disclosure includes references to an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more of the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent claims that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . W, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . W, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third," when applied to a feature, do not imply any type of ordering (e.g., spatial, temporal, logical, etc.), unless stated otherwise.

The phrase "based on" is used to describe one or more factors that affect a determination. This term does not foreclose the possibility that additional factors may affect the determination. That is, a determination may be solely based on specified factors, or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as being "configured to" perform some task refers to something physical, such as a device, a circuit, or a system having a processor unit and a memory storing program instructions executable to implement the task, etc. This phrase is not used herein to refer to something intangible.

In some cases, various units/circuits/components may be described herein as performing a set of tasks or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112 (f) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), a functional unit, a memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements may be defined by the functions or operations that they are configured to implement. The arrangement of such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as a structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used to transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits, or portions thereof, may also be custom-designed in a schematic editor and captured into the integrated circuit design along with synthesized circuitry. The integrated circuits may include transistors and other circuit elements (e.g., passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

What is claimed is:

1. An apparatus, comprising:
a phase circuit configured to generate a modulation signal using an input signal and a recovered clock signal, wherein the input signal encodes a plurality of data symbols; and
a phase-locked loop circuit configured to:
generate the recovered clock signal using the modulation signal;
generate a reduced frequency signal, wherein a first frequency of the reduced frequency signal is less than a second frequency of the recovered clock signal;
generate a plurality of phase signals using the reduced frequency signal;
generate, using the modulation signal, a feedback signal based on respective phases of at least two phase signals of the plurality of phase signals, wherein a ratio of respective frequencies of the feedback signal and the recovered clock signal is a non-integer value; and
modify the recovered clock signal using the feedback signal and a reference signal.

2. The apparatus of claim 1, wherein to generate the modulation signal, the phase circuit is further configured to:
perform a phase-frequency comparison of the input signal and the recovered clock signal to generate an error signal; and
filter the error signal to generate the modulation signal.

3. The apparatus of claim 1, wherein to modify the recovered clock signal, the phase-locked loop circuit is further configured to:
perform a phase-frequency comparison of the reference signal and the feedback signal to generate a phase-difference signal;
filter the phase-difference signal to generate a filtered signal; and adjust a frequency of the recovered clock signal using the filtered signal.

4. The apparatus of claim 3, wherein the phase-locked loop circuit is further configured to adjust the frequency of the recovered clock signal using the filtered signal and the modulation signal.

5. The apparatus of claim 1, wherein to generate the feedback signal, the phase-locked loop circuit is further configured to determine a phase relationship between the feedback signal and the at least two phase signals using the modulation signal.

6. The apparatus of claim 4, wherein the phase-locked loop circuit includes an oscillator circuit configured to generate the recovered clock signal using the filtered signal and the modulation signal.

7. A method, comprising:

receiving, by a phase circuit, an input signal that encodes a plurality of data symbols;

generating, by the phase circuit, a modulation signal using the input signal and a recovered clock signal;

generating, by a phase-locked loop circuit, the recovered clock signal using the modulation signal;

generating, by the phase-locked loop circuit, a reduced frequency signal, wherein a first frequency of the reduced frequency signal is less than a second frequency of the recovered clock signal;

generating, by the phase-locked loop circuit, a plurality of phase signals using the reduced frequency signal;

generating, by the phase-locked loop circuit using the modulation signal, a feedback signal based on respective phases of at least two phase signals of the plurality of phase signals, wherein a ratio of respective frequencies of the feedback signal and the recovered clock signal is a non-integer value; and modifying, by the phase-locked loop circuit, the recovered clock signal using the feedback signal and a reference signal.

8. The method of claim 7, wherein generating, by the phase circuit, the modulation signal includes:

performing, by the phase circuit, a phase-frequency comparison of the input signal and the recovered clock signal to generate an error signal; and filtering, by the phase circuit, the error signal to generate the modulation signal.

9. The method of claim 7, wherein modifying, by the phase-locked loop circuit, the recovered clock signal using the feedback signal and the reference signal includes:

performing, by the phase-locked loop circuit, a phase-frequency comparison of the reference signal and the feedback signal to generate a phase-difference signal;

filtering, by the phase-locked loop circuit, the phase-difference signal to generate a filtered signal; and adjusting, by the phase-locked loop circuit, a frequency of the recovered clock signal using the filtered signal.

10. The method of claim 9, further comprising adjusting, by the phase-locked loop circuit, the frequency of the recovered clock signal using the filtered signal and the modulation signal.

11. The method of claim 7, wherein generating, by the phase-locked loop circuit, the feedback signal includes determining, by the phase-locked loop circuit, a phase relationship between the feedback signal and the at least two phase signals using the modulation signal.

12. The method of claim 7, further comprising sampling, by a sampler circuit using the recovered clock signal, the input signal to generate a plurality of recovered data symbols.

13. The method of claim 10, wherein the phase-locked loop circuit includes an oscillator circuit, and wherein adjusting the frequency of the recovered clock signal includes controlling a frequency of the oscillator circuit using the filtered signal and the modulation signal.

14. An apparatus, comprising:

a first device configured to transmit a data signal via a communication bus, wherein the data signal encodes a plurality of data symbols; and a second device configured to:

receive the data signal via the communication bus;

generate a modulation signal using the data signal and a recovered clock signal;

generate a reduced frequency signal, wherein a first frequency of the reduced frequency signal is less than a second frequency of the recovered clock signal;

generate a plurality of phase signals using the reduced frequency signal;

generate a feedback signal based on respective phases of at least two phase signals of the plurality of phase signals, wherein a ratio of respective frequencies of the feedback signal and the recovered clock signal is a non-integer value; and modify the recovered clock signal using the feedback signal and a reference signal.

15. The apparatus of claim 14, wherein to generate the modulation signal, the second device is further configured to:

perform a phase-frequency comparison of the data signal and the recovered clock signal to generate an error signal; and filter the error signal to generate the modulation signal.

16. The apparatus of claim 14, wherein to modify the recovered clock signal, the second device is further configured to:

perform a phase-frequency comparison of the reference signal and the feedback signal to generate a phase-difference signal;

filter the phase-difference signal to generate a filtered signal; and adjust a frequency of the recovered clock signal using the filtered signal.

17. The apparatus of claim 16, wherein the second device is further configured to adjust the frequency of the recovered clock signal using the filtered signal and the modulation signal.

18. The apparatus of claim 14, wherein to generate the feedback signal, the second device is further configured to determine a phase relationship between the feedback signal and the at least two phase signals using the modulation signal.

19. The apparatus of claim 14, wherein the second device is further configured to sample, using the recovered clock signal, the data signal to generate a plurality of recovered data symbols.

20. The apparatus of claim 17, wherein the second device includes an oscillator circuit configured to generate the recovered clock signal using the filtered signal and the modulation signal.

* * * * *